United States Patent
Kobayashi

(10) Patent No.: US 11,959,496 B2
(45) Date of Patent: Apr. 16, 2024

(54) OPERATION PANEL FOR MACHINE TOOL

(71) Applicant: DMG MORI CO., LTD., Nara (JP)

(72) Inventor: Hiroshi Kobayashi, Nara (JP)

(73) Assignee: DMG MORI CO., LTD., Nara (JP)

( * ) Notice: Subject to any disclaimer, the term of this patent is extended or adjusted under 35 U.S.C. 154(b) by 0 days.

(21) Appl. No.: 18/034,267

(22) PCT Filed: Oct. 27, 2020

(86) PCT No.: PCT/JP2020/040204
§ 371 (c)(1),
(2) Date: Apr. 27, 2023

(87) PCT Pub. No.: WO2022/091201
PCT Pub. Date: May 5, 2022

(65) Prior Publication Data
US 2023/0407885 A1 Dec. 21, 2023

(51) Int. Cl.
*F04D 29/66* (2006.01)
*B23Q 11/12* (2006.01)
*B23Q 11/14* (2006.01)

(52) U.S. Cl.
CPC .......... *F04D 29/667* (2013.01); *B23Q 11/126* (2013.01); *B23Q 11/14* (2013.01); *F05D 2260/96* (2013.01)

(58) Field of Classification Search
CPC ...... F04D 25/0613; F04D 25/08; F04D 25/12; F04D 29/403; F04D 29/522; F04D 29/541; F04D 29/545; F04D 29/547; F04D 29/602
See application file for complete search history.

(56) References Cited

U.S. PATENT DOCUMENTS

| | | | |
|---|---|---|---|
| 6,215,659 B1* | 4/2001 | Chen | H05K 7/20172 174/15.1 |
| 2008/0144281 A1* | 6/2008 | Chen | G06F 1/20 361/695 |
| 2013/0342992 A1 | 12/2013 | MacDonald et al. | |

(Continued)

FOREIGN PATENT DOCUMENTS

| JP | 2013-171249 A | 9/2013 |
|---|---|---|
| JP | 2014-204496 A | 10/2014 |

(Continued)

*Primary Examiner* — Brian O Peters
(74) *Attorney, Agent, or Firm* — IP Business Solutions, LLC

(57) ABSTRACT

An operation panel for a machine tool includes: a blower device that includes a plurality of blade sections and a center axis section, the plurality of blade sections rotating around a center axis, the center axis section having a circular columnar shape around the center axis and being disposed on a radial-directional inside about the center axis relative to the plurality of blade sections the blower device sucking air in an axial direction about the center axis and blowing out the air in the axial direction about the center axis an opposed wall that is disposed on an air suction side of the blower device and that is disposed so as to face the blower device in the axial direction about the center axis; and an intermediate member that is provided between the opposed wall and the center axis section in the axial direction about the center axis.

4 Claims, 14 Drawing Sheets

(56) References Cited

U.S. PATENT DOCUMENTS

2015/0003859 A1\* 1/2015 Tanida ............... H05K 7/20145
399/92
2016/0221139 A1 8/2016 Seitz et al.

FOREIGN PATENT DOCUMENTS

| JP | 2016-530658 A | 9/2016 |
| WO | 2009116647 A1 | 9/2009 |

\* cited by examiner

OPERATION PANEL FOR MACHINE TOOL

TECHNICAL FIELD

The invention relates to an operation panel for a machine tool.

BACKGROUND ART

For example, Japanese National Patent Publication No. 2016-530658 (PTL 1) discloses a control console for a numerically controlled machine tool. The control console includes a housing, a screen that is disposed at a front side in the housing, at least one circuit substrate that includes an electric component, and a cooling channel through which fluid can pass.

CITATION LIST

Patent Literature

PTL 1: Japanese National Patent Publication No. 2016-530658

SUMMARY OF INVENTION

Technical Problem

As disclosed in the above-described PTL 1, an operation panel for a machine tool is known. In the operation panel for the machine tool, a blower device is used for the purpose of the cooling of various cooling target objects accommodated in a case of the operation panel, and other purposes. However, when an air passage leading to the blower device is provided in a limited space within the case, there is a possibility that turbulent flow is produced in the airflow. On this occasion, loud noise is generated due to the blowing by the blower device.

Hence, an object of the invention is to solve the above problem, and to provide an operation panel for a machine tool that restrains noise from being generated due to the blowing by the blower device.

Solution to Problem

An operation panel for a machine tool according to the invention includes: a blower device that includes a plurality of blade sections and a center axis section, the plurality of blade sections being disposed so as to be spaced from each other in a circumferential direction about a predetermined axis and rotating around the predetermined axis, the center axis section having a circular columnar shape around the predetermined axis and being disposed on a radial-directional inside about the predetermined axis relative to the plurality of blade sections, the blower device sucking air in an axial direction about the predetermined axis and blowing out the air in the axial direction about the predetermined axis; an opposed wall that is disposed on an air suction side of the blower device and that is disposed so as to face the blower device in the axial direction about the predetermined axis; and an intermediate member that is provided between the opposed wall and the center axis section in the axial direction about the predetermined axis.

According to the operation panel for the machine tool configured in this way, the intermediate member occupies a space between the opposed wall and the center axis section in the axial direction about the predetermined axis, and thereby it is possible to restrain turbulent flow from being generated at a position that faces the center axis section. Thereby, it is possible to restrain noise from being generated due to the blowing by the blower device.

Moreover, preferably, the intermediate member has a circular columnar shape. A center axis of the intermediate member extends in the axial direction about the predetermined axis.

According to the operation panel for the machine tool configured in this way, the intermediate member can more efficiently occupy the space between the opposed wall and the center axis section in the axial direction about the predetermined axis. Thereby, it is possible to further reduce the noise due to the blowing by the blower device.

Moreover, preferably, the center axis of the intermediate member extends on a straight line resulting from elongating the predetermined axis.

According to the operation panel for the machine tool configured in this way, the intermediate member can more efficiently occupy the space between the opposed wall and the center axis section in the axial direction about the predetermined axis. Thereby, it is possible to further reduce the noise due to the blowing by the blower device.

Moreover, preferably, the intermediate member is connected to the opposed wall.

According to the operation panel for the machine tool configured in this way, it is not necessary to separately provide a support structure that supports the intermediate member, and therefore it is possible to reduce the noise due to the blowing by the blower device, while simplifying the configuration.

Moreover, preferably, the operation panel for the machine tool includes a case that includes the opposed wall and that accommodates the blower device. The opposed wall performs compartment formation of an internal space that accommodates the blower device. The operation panel for the machine tool further includes a partition wall section that is disposed in the case so as to face the opposed wall and to which the blower device is attached. An air passage through which air flows toward the blower device is provided between the opposed wall and the partition wall section.

According to the operation panel for the machine tool configured in this way, even when the distance between the opposed wall and the partition wall section is small, the noise can be reduced by the disposition of the intermediate member. Thereby, it is possible to achieve the reduction in the thickness of the case.

Advantageous Effect of Invention

As described above, according to the invention, it is possible to provide the operation panel for the machine tool that restrain noise from being generated due to the blowing by the blower device.

DESCRIPTION OF EMBODIMENTS

Figure 1:
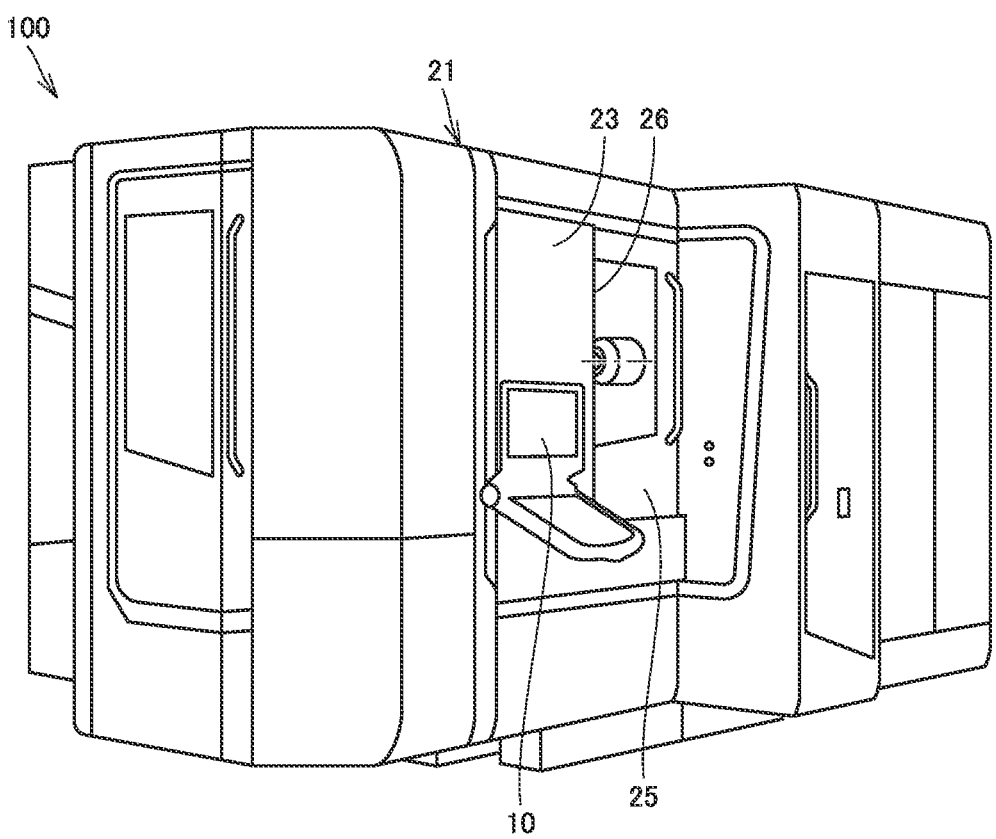
FIG. 1 is a perspective view showing a machine tool for which an operation panel in Embodiment 1 of the invention is used.

With reference to the drawings, embodiments of the invention will be described. In the drawings referred to below, identical or equivalent members are denoted by identical numbers.

Embodiment 1

FIG. 1 is a perspective view showing a machine tool for which an operation panel in Embodiment 1 of the invention is used. With reference to FIG. 1, a machine tool 100 is a machining center that performs workpiece processing by causing a rotating tool to contact with a workpiece, and more particularly, is a horizontal-type machining center in which a rotation center axis of the tool extends in the horizontal direction. Machine tool 100 is an NC (Numerically Control) machine tool in which various actions for workpiece processing are automated under a numerical control by a computer.

Machine tool 100 includes a cover body 21. Cover body 21 performs the compartment formation of a processing area, and forms the external appearance of machine tool 100. The processing area is a space where the processing of the workpiece is performed, and is tightly closed such that foreign substances due to the workpiece processing, as exemplified by chip or coolant, do not leak to the exterior of the processing area.

Cover body 21 includes a front cover 23 and a door section 25. On front cover 23, an opening section 26 is provided. Opening section 26 opens the processing area to the external space. Door section 25 is provided on opening section 26. Door section 25 can slide between an opening position where opening section 26 is in an opening state and a closing position (the position of door section 25 shown in FIG. 1) where opening section 26 is in a closing state.

Machine tool 100 further includes an operation panel 10. Operation panel 10 is provided in the exterior of the processing area. Operation panel 10 is attached to front cover 23. Operation panel 10 is provided so as to be adjacent to opening section 26.

The operation panel in the present invention is not limited to the horizontal-type machining center, and can be applied to a turning machine, a vertical-type machining center, a combined processing machine that has a lathe turning function and a milling function, or an AM/SM hybrid processing machine that can perform an additive processing (AM (Additive manufacturing) processing) for the workpiece and a subtractive processing (SM (Subtractive manufacturing) processing) for the workpiece, for example.

Figure 2:
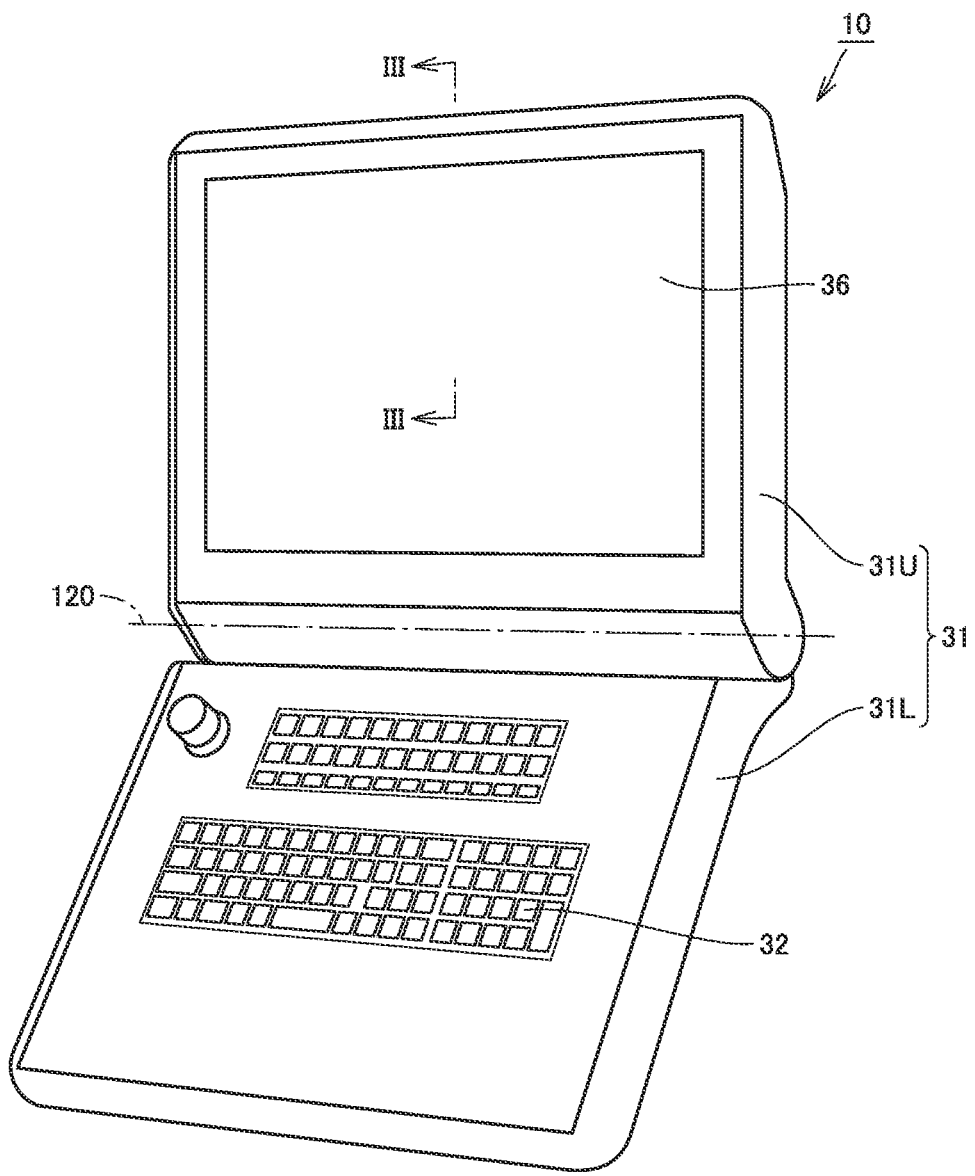
FIG. 2 is a perspective view showing the operation panel in FIG. 1.

Next, the overall structure of operation panel 10 will be described. FIG. 2 is a perspective view showing the operation panel in FIG. 1. With reference to FIG. 2, operation panel 10 includes a case 31. Case 31 forms the external appearance of operation panel 10.

Case 31 includes a first case 31U and a second case 31L. First case 31U is disposed above second case 31L. First case 31U is coupled to second case 31L so as to be capable of pivoting around a pivoting center axis 120. Each of first case 31U and second case 31L has a flat plate shape. Each of first case 31U and second case 31L has a flat plate shape parallel to a plane that contains pivoting center axis 120.

Operation panel 10 includes an operation section 32 for various buttons, dials, switches or others that are used when a worker operates machine tool 100, a display section 36 showing the processing state and others of the workpiece in machine tool 100, and the like. Operation section 32 for buttons, dials, switches or others is provided in second case 31L. Display section 36 is provided in first case 31U.

Figure 3:
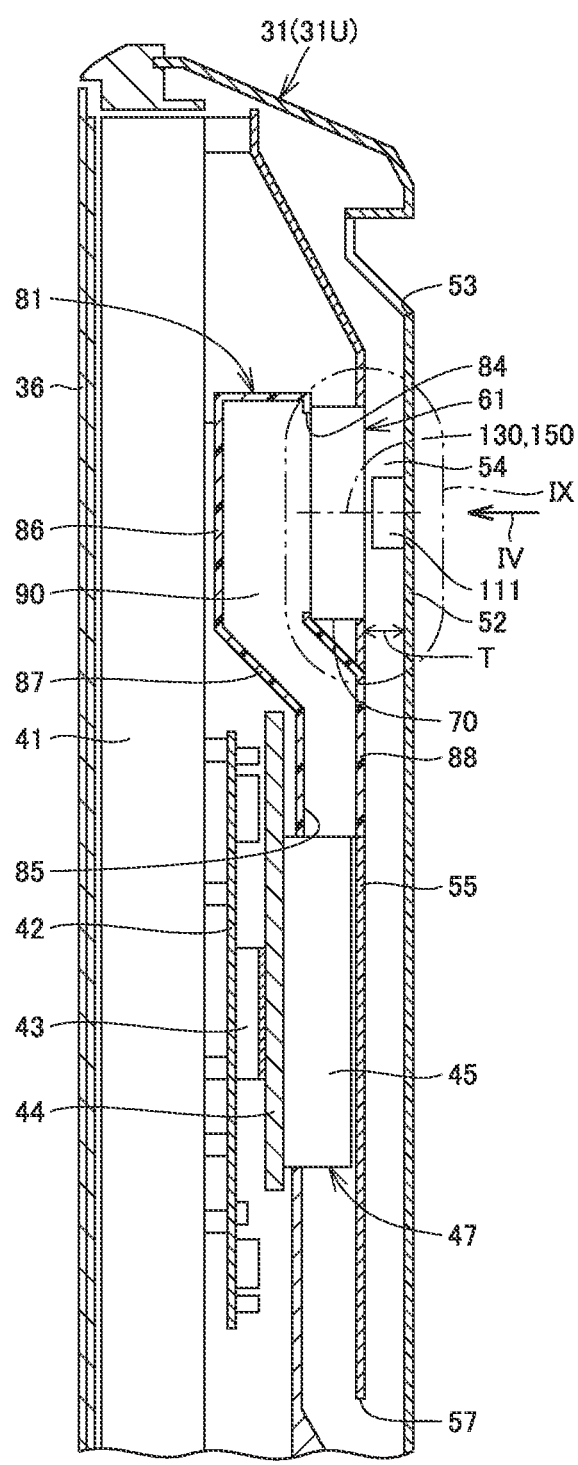
FIG. 3 is a sectional view showing the operation panel as viewed in the direction of the arrow on line in FIG. 2.

FIG. 3 is a sectional view showing the operation panel as viewed in the direction of the arrow on line 111411 in FIG. 2. With reference to FIG. 2 and FIG. 3, first case 31U includes an opposed wall 52. Opposed wall 52 is disposed on the back side of display section 36. Opposed wall 52 extends in a planar direction orthogonal to the thickness direction of first case 31U. Opposed wall 52 and display section 36 are disposed so as to be spaced from each other in the thickness direction of first case 31U. Opposed wall 52 performs the compartment formation of an internal space that accommodates a later-described blower device 61 and the like, together with display section 36.

Operation panel 10 further includes a partition wall section 55. Partition wall section 55 is disposed in first case 31U. Partition wall section 55 faces opposed wall 52 so as to be spaced. Partition wall section 55 extends parallel to opposed wall 52. The distance between opposed wall 52 and partition wall section 55 in the thickness direction of first case 31U is smaller than the distance between display section 36 and partition wall section 55 in the thickness direction of first case 31U.

An air passage 54 is formed between opposed wall 52 and partition wall section 55. An intake port 53 is provided on opposed wall 52. Intake port 53 is constituted by a through-hole that passes through opposed wall 52. Intake port 53 provides communication between air passage 54 and the exterior of first case 31U.

Operation panel 10 further includes a display device 41. Display device 41 is constituted by a display panel such as a liquid crystal panel or an organic EL. Display device 41 has a thin plate shape, and is disposed parallel to a plane orthogonal to the thickness direction of first case 31U. Display section 36 is constituted by a display surface of display device 41.

Operation panel 10 further includes an electronic component 43 and a heatsink 47. Electronic component 43 and heatsink 47 are disposed between display device 41 and partition wall section 55 in the thickness direction of first case 31U. Electronic component 43 is constituted by a CPU (Central Processing Unit). Electronic component 43 is mounted on a substrate 42. Substrate 42 is disposed parallel to opposed wall 52 and partition wall section 55. Electronic component 43 is disposed on the opposite side of display device 41 with respect to substrate 42.

Heatsink 47 is made of a metal such as aluminum. Heatsink 47 is accommodated in first case 31U. Heatsink 47 is disposed between electronic component 43 and partition wall section 55 in the thickness direction of first case 31U.

Heatsink 47 is connected to electronic component 43. Heatsink 47 is thermally connected to electronic component 43. Grease or a thermally conductive sheet may be interposed between heatsink 47 and electronic component 43. Heatsink 47 is disposed so as to overlap with electronic component 43 in the thickness direction (the axial direction about a later-described center axis 130) of first case 31U.

Heatsink 47 includes a radiator plate 44 and a plurality of fins 45. Radiator plate 44 is disposed parallel to opposed wall 52 and partition wall section 55. Radiator plate 44 faces substrate 42 through electronic component 43. Radiator plate 44 is connected to electronic component 43. The plurality of fins 45 is disposed between partition wall section 55 and radiator plate 44 in the thickness direction of first case 31U. The plurality of fins 45 is provided integrally with radiator plate 44. The plurality of fins 45 extends from radiator plate 44 toward partition wall section 55. The plurality of fins 45 is disposed so as to be spaced from each other in a direction orthogonal to the thickness direction of first case 31U.

Operation panel 10 further includes blower device 61 and an air guide member 81. Blower device 61 and air guide member 81 are disposed in first case 31U. Blower device 61 and air guide member 81 are disposed between display device 41 and partition wall section 55 in the thickness direction of first case 31U. Blower device 61 is connected to air guide member 81. Blower device 61 is attached to partition wall section 55. Blower device 61 faces opposed wall 52 through air passage 54. Air passage 54 is communicated with a suction side of blower device 61.

Air guide member 81 forms an air flow passage 90 in first case 31U. Air guide member 81 is constituted by a duct that forms air flow passage 90.

An upstream-side opening section 84 and a downstream-side opening section 85 are provided in air guide member 81. Air flow passage 90 extends between upstream-side opening section 84 and downstream-side opening section 85. Upstream-side opening section 84 is provided at an end section on the upstream side of the airflow in air flow passage 90. Air flow passage 90 is communicated with an ejection side of blower device 61 through upstream-side opening section 84.

Downstream-side opening section 85 is provided at an end section on the downstream side of the airflow in air flow passage 90. Downstream-side opening section 85 is opened to a space between radiator plate 44 and partition wall section 55. Downstream-side opening section 85 is opened so as to face heatsink 47. Downstream-side opening section 85 is opened so as to face the plurality of fins 45.

By the drive of blower device 61, the air in the exterior of first case 31U is taken into air passage 54 in first case 31U through intake port 53. The air to flow through air passage 54 is blown out from blower device 61 to air flow passage 90. The air passes through air flow passage 90, and is guided toward heatsink 47 (the plurality of fins 45). The air whose temperature rises by the heat exchange with heatsink 47 flows around an end section 57 of partition wall section 55, and flows to air passage 54. The air flowing to air passage 54 is exhausted to the exterior of first case 31U through an exhaust port (not illustrated) provided on opposed wall 52.

Figure 4:
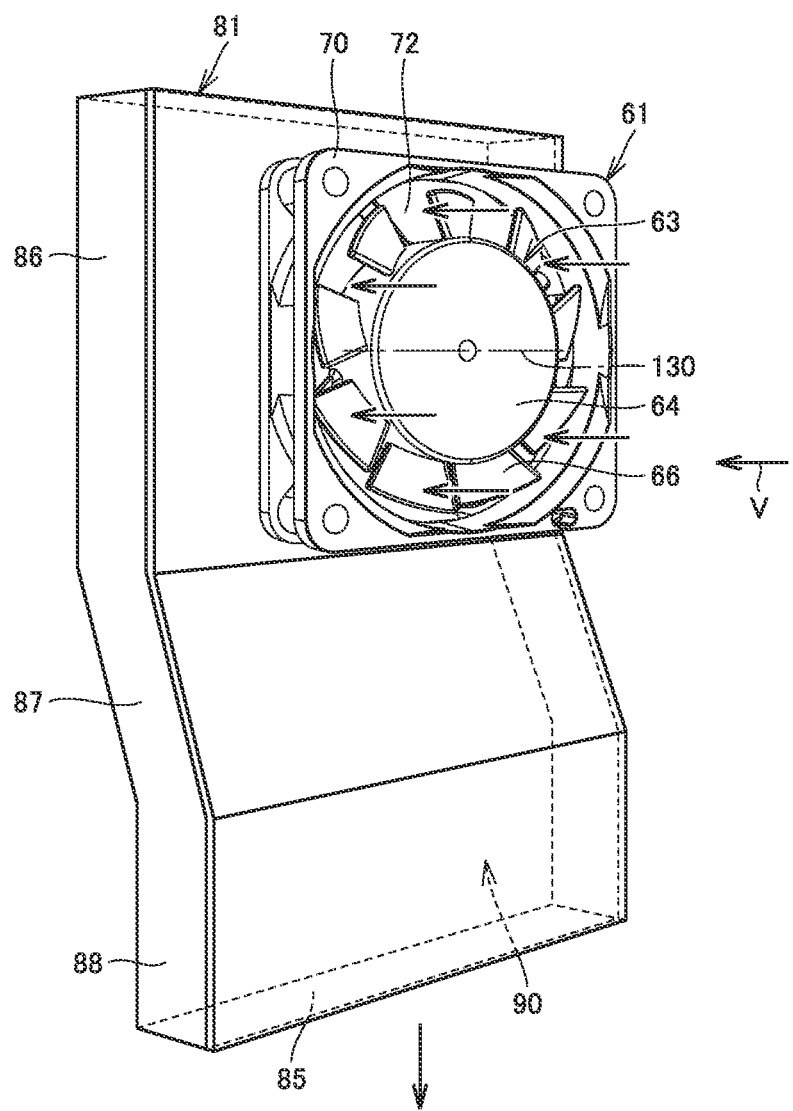
FIG. 4 is a perspective view showing an air guide member and a blower device in FIG. 3.
Figure 5:
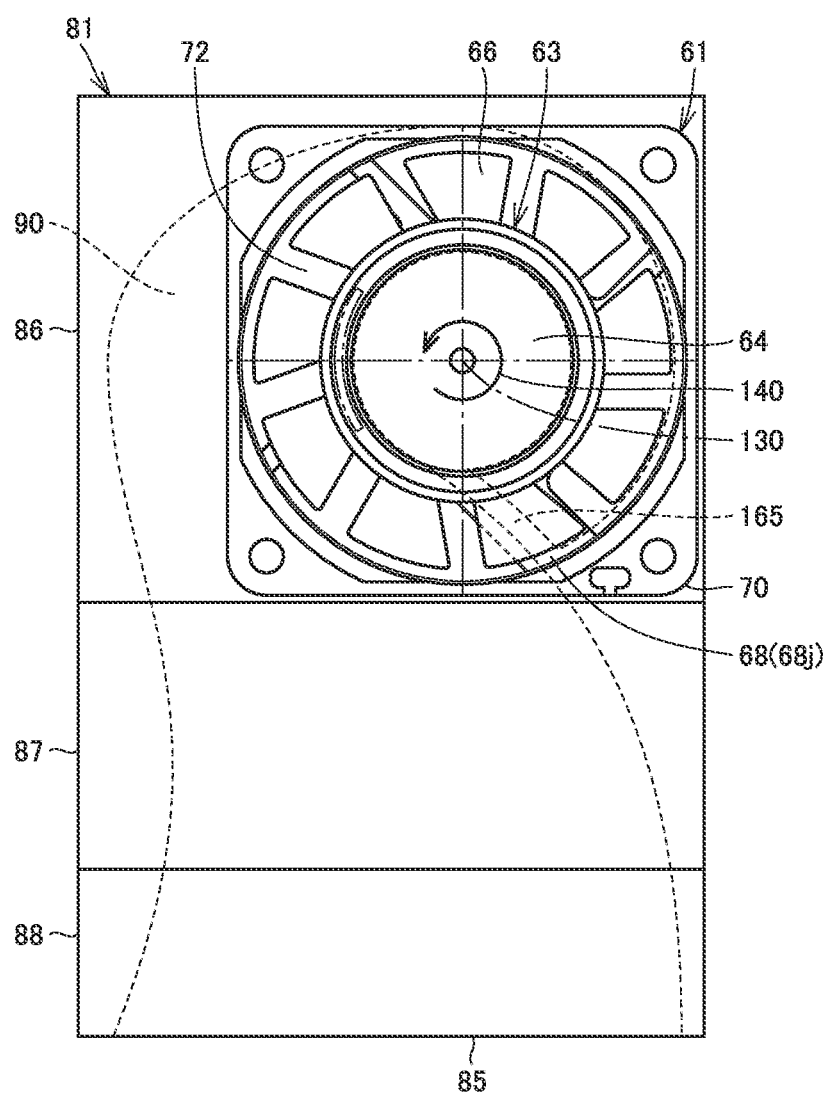
FIG. 5 is a plan view showing the air guide member and the blower device as viewed in the direction indicated by arrow V in FIG. 4.
Figure 6:
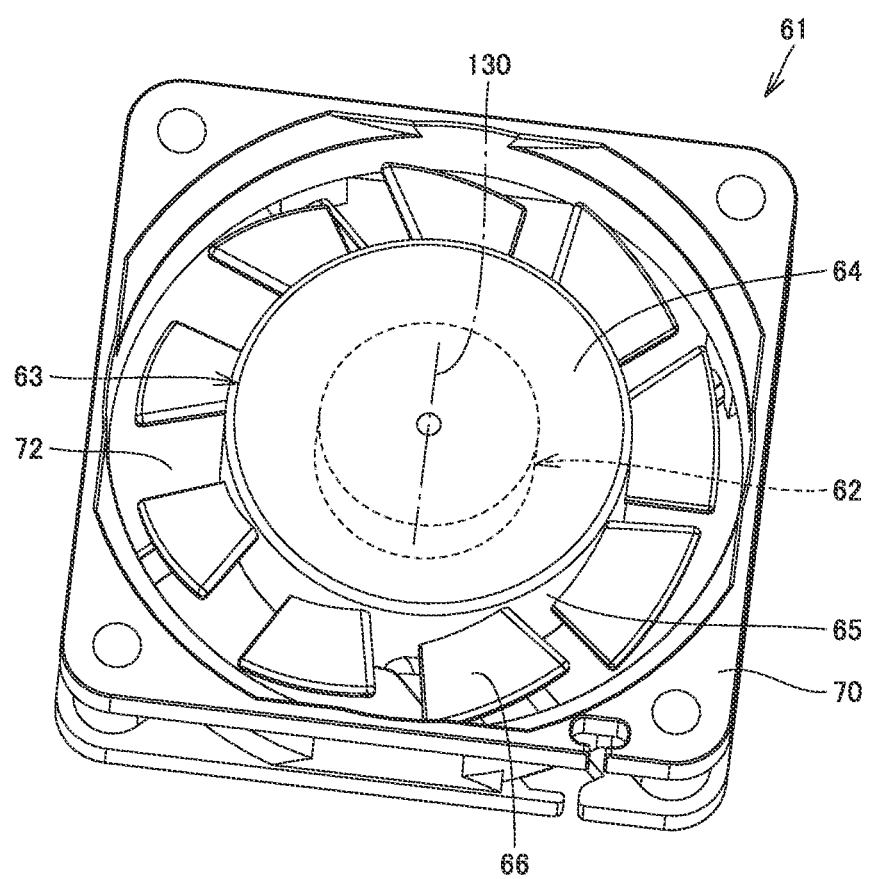
FIG. 6 is a perspective view showing the blower device in FIG. 3.
Figure 7:
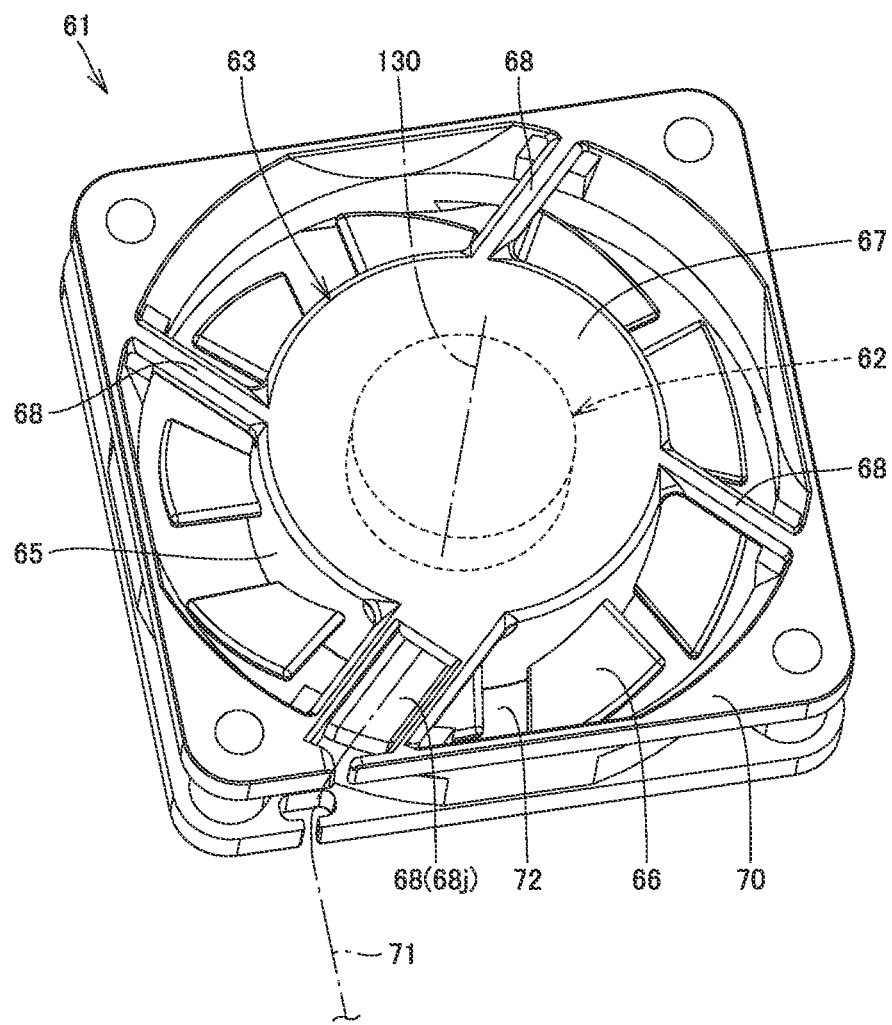
FIG. 7 is another perspective view showing the blower device in FIG. 3.

Next, more specific structures of blower device 61 and air guide member 81 will be described. FIG. 4 is a perspective view showing the air guide member and the blower device in FIG. 3. FIG. 5 is a plan view showing the air guide member and the blower device as viewed in the direction indicated by arrow V in FIG. 4. FIG. 6 and FIG. 7 are perspective views showing the blower device in FIG. 3. In FIG. 6, blower device 61 on the suction side is shown, and in FIG. 7, blower device 61 on the ejection side is shown.

With reference to FIG. 3 to FIG. 7. blower device 61 includes a plurality of blade sections 66, a center axis section 63 and a motor 62.

The plurality of blade sections 66 is disposed so as to be spaced from each other in the circumferential direction about center axis 130, which is a virtual straight line. The plurality of blade sections 66 is provided at regular intervals in the circumferential direction of center axis 130. Center axis 130 extends in the thickness direction of first case 31U. The axial direction about center axis 130 corresponds to the thickness direction of first case 31U.

Blower device 61 is an axial-flow type that blows out air in the axial direction about center axis 130. Blower device 61 is a propeller fan. Blower device 61 has an external appearance having a flat plate shape whose thickness direction is the axial direction about center axis 130. An end face side of blower device 61 that is oriented in one direction along the axial direction about center axis 130 corresponds to the suction side, and an end face side of blower device 61 that is oriented in the reverse direction along the axial direction about center axis 130 corresponds to the ejection side.

Center axis section 63 is provided on the axis of center axis 130. Center axis section 63 has a circular columnar shape around center axis 130. Center axis section 63 is disposed on a radial-directional inside about center axis 130 relative to the plurality of blade sections 66.

Center axis section 63 includes a first disk section 64, a second disk section 67 and a cylinder section 65. First disk section 64 and second disk section 67 have a disk shape around center axis 130. First disk section 64 and second disk section 67 are disposed so as to be spaced from each other in the axial direction about center axis 130. First disk section 64 is disposed on the suction side, and second disk section 67 is disposed on the ejection side.

Cylinder section 65 has a cylinder shape around center axis 130. Cylinder section 65 is connected to first disk section 64 at one end in the axial direction about center axis 130. Cylinder section 65 is isolated from second disk section 67. Root sections of the plurality of blade sections 66 are connected to cylinder section 65.

Motor 62 is accommodated in center axis section 63. Motor 62 is disposed in a space that is surrounded by first disk section 64, second disk section 67 and cylinder section 65. Motor 62 is supported by second disk section 67. An output shaft of motor 62 is connected to first disk section 64. The rotation from motor 62 is transmitted to first disk section 64 and cylinder section 65, and thereby the plurality of blade sections 66 rotates around center axis 130 in the direction indicated by arrow 140 shown in FIG. 5.

Blower device 61 further includes a fan guard 70 and a plurality of rib sections 68. Fan guard 70 is provided so as to surround outer circumferences of the plurality of blade sections 66. Fan guard 70 is provided at a position away from center axis section 63 to a radial-directional outside about center axis 130. The plurality of blade sections 66 is disposed in a space 72 between center axis section 63 and fan guard 70 in the radial direction about center axis 130. A gap is provided between fan guard 70 and the plurality of blade sections 66 in the radial direction about center axis 130.

The plurality of rib sections 68 extends between fan guard 70 and center axis section 63. The plurality of rib sections 68 is disposed so as to be spaced from each other in the circumferential direction about center axis 130. Rib sections 68 extend from the radial-directional inside about center axis 130 toward the radial-directional outside about center axis 130, while deviating in the circumferential direction about center axis 130. Rib sections 68 are continuous with an outer circumferential edge of second disk section 67, at end sections on the radial-directional inside about center axis 130. Rib sections 68 are continuous with fan guard 70, at end sections on the radial-directional outside about center axis 130.

The plurality of rib sections 68 includes a rib section 68j. As shown in FIG. 7, a wire 71 extending from motor 62 is routed along rib section 68j. Wire 71 includes a power wire and signal wire of motor 62. Wire 71 is drawn out from center axis section 63 accommodating motor 62 to fan guard 70 through rib section 68j. The width of rib section 68j in the circumferential direction about center axis 130 is larger than the width of rib sections 68 other than rib section 68j in the circumferential direction about center axis 130.

Air guide member 81 includes a first planar section 86, an inclined section 87 and a second planar section 88. Each of first planar section 86 and second planar section 88 has a flat plate shape whose thickness direction is the axial direction about center axis 130. Inclined section 87 connects first planar section 86 and second planar section 88. Inclined section 87 has a flat plate shape that extends in an oblique direction with respect to first planar section 86 and second planar section 88.

Blower device 61 is connected to first planar section 86. First planar section 86 extends in a planar direction orthogonal to center axis 130. Blower device 61 is provided so as to be stacked on first planar section 86 in the axial direction about center axis 130. Upstream-side opening section 84 is provided on first planar section 86. By upstream-side opening section 84, air flow passage 90 is opened toward the axial direction about center axis 130. Upstream-side opening section 84 is opened in a range where center axis section 63 and space 72 are projected in the axial direction about center axis 130.

Second planar section 88 is disposed at a position away from first planar section 86 in the radial direction about center axis 130 and deviating from first planar section 86 in the axial direction about center axis 130. Second planar section 88 extends in the planar direction orthogonal to center axis 130. Downstream-side opening section is provided on second planar section 88. By downstream-side opening section 85, air flow passage 90 is opened toward the radial-directional outside about center axis 130.

Second planar section 88 is provided at a position that deviates from first planar section 86 in a direction of getting close to partition wall section 55 in the axial direction about center axis 130. Second planar section 88 forms a step shape in the axial direction about center axis 130, together with first planar section 86. Blower device 61 is disposed in the step portion formed by first planar section 86 and second planar section 88.

Inclined section 87 is disposed between first planar section 86 and second planar section 88 in the radial direction about center axis 130. Inclined section 87 extends between first planar section 86 and second planar section 88 in an oblique direction with respect to center axis 130.

Blower device 61, second planar section 88 and heatsink 47 (the plurality of fins 45) are provided so as to be arrayed in this order from the radial-directional inside about center axis 130 to the radial-directional outside about center axis 130. Blower device 61, second planar section 88 and heatsink 47 (the plurality of fins 45) are provided on an identical plane orthogonal to center axis 130. Second planar section 88 is provided so as to face blower device 61 through inclined section 87 in the radial direction about center axis 130. Heatsink 47 (the plurality of fins 45) is provided so as to face second planar section 88 in the radial direction about center axis 130.

First planar section 86 and electronic component 43 are provided so as to be arrayed in this order from the radial-directional inside about center axis 130 to the radial-directional outside about center axis 130. First planar section 86 and electronic component 43 are provided on an identical plane orthogonal to center axis 130. Electronic component 43 is provided so as to face electronic component 43 through inclined section 87 in the radial direction about center axis 130.

Second planar section 88 is provided so as to be stacked on radiator plate 44 in the axial direction about center axis 130.

In this configuration, by using the step shape formed by first planar section 86 and second planar section 88 of air guide member 81, it is possible to dispose blower device 61, air guide member 81, electronic component 43 and heatsink 47 in a compact space in the axial direction about center axis 130. Thereby, it is possible to reduce the thickness of first case 31U.

Figure 8:
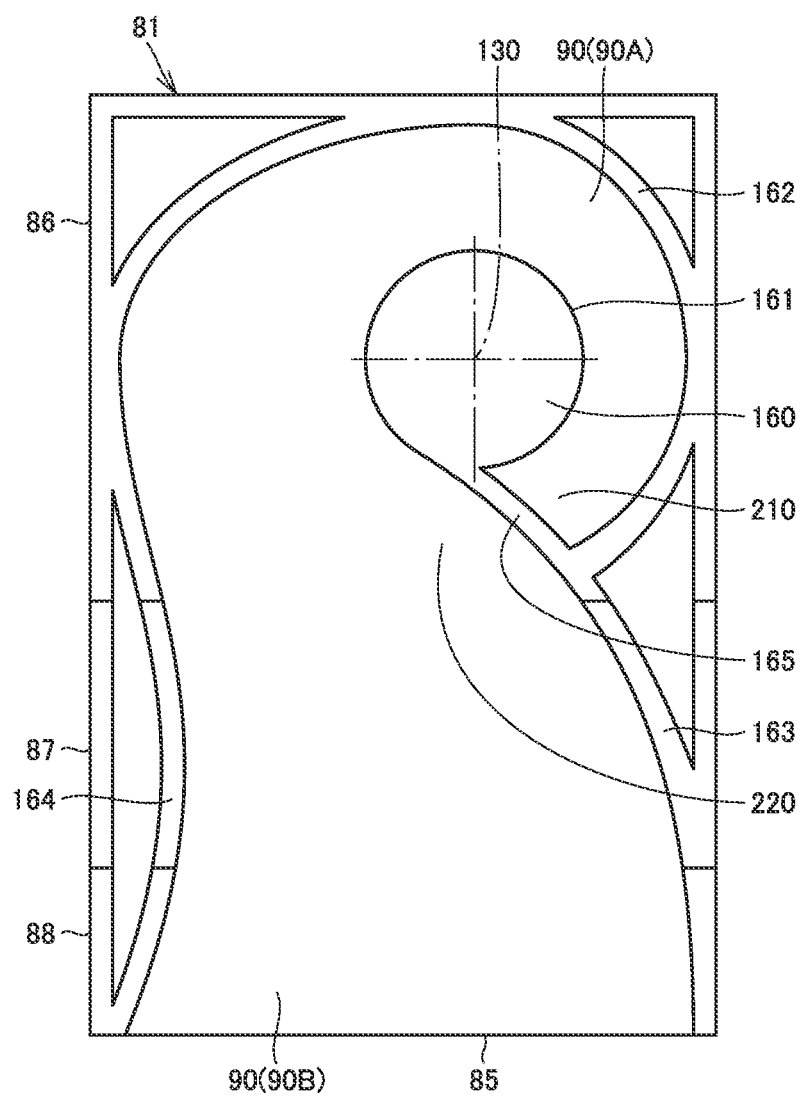
FIG. 8 is a plan view showing the internal structure of the air guide member.

FIG. 8 is a plan view showing the internal structure of the air guide member. With reference to FIG. 3 to FIG. 8, air flow passage 90 includes a round section 90A and an extension section 90B.

Round section 90A is opened toward the axial direction about center axis 130 through upstream-side opening section 84. The air blown out from blower device 61 flows into round section 90A. Extension section 90B is disposed on the downstream side of the airflow in air flow passage 90, relative to round section 90A. Extension section 90B is opened toward the radial-directional outside about center axis 130 through downstream-side opening section 85.

Round section 90A extends in the circumferential direction about center axis 130. Round section 90A extends in the circumferential direction about center axis 130, at a position that faces the plurality of blade sections 66 in the axial direction about center axis 130. Round section 90A extends in the circumferential direction about center axis 130, at a position that faces space 72 in the axial direction about center axis 130.

Round section 90A is provided in first planar section 86. Air guide member 81 (first planar section 86) includes a peak section 160, an inner circumferential side wall section 161, and an outer circumferential side wall section 162.

Peak section 160 has a disk shape around center axis 130. Peak section 160 faces center axis section 63 (second disk section 67) of blower device 61 in the axial direction about center axis 130. Inner circumferential side wall section 161 extends from a peripheral section of peak section 160 in a direction of getting away from blower device 61 in the axial direction about center axis 130. Inner circumferential side wall section 161 extends in the circumferential direction about center axis 130 toward the radial-directional outside about center axis 130. Inner circumferential side wall section 161 has a constant radius around center axis 130, regardless of the position in the circumferential direction about center axis 130.

Outer circumferential side wall section 162 extends in the circumferential direction about center axis 130 toward the radial-directional inside about center axis 130. Outer circumferential side wall section 162 faces inner circumferential side wall section 161 in the radial direction about center axis 130. Round section 90A is formed between inner circumferential side wall section 161 and outer circumferential side wall section 162 in the radial direction about center axis 130. Outer circumferential side wall section 162 may include a zone around center axis 130 in which the radius increases from the upstream side of the airflow in round section 90A toward the downstream side of the airflow in round section 90A.

Extension section 90B extends from an end section of round section 90A on the downstream side of the airflow in air flow passage 90 toward downstream-side opening section 85. Extension section 90B extends from the radial-directional inside about center axis 130 toward the radial-directional outside about center axis 130.

Extension section 90B is provided in inclined section 87 and second planar section 88. Air guide member 81 (inclined section 87, second planar section 88) includes a first side wall section 163 and a second side wall section 164. First side wall section 163 and second side wall section 164 face each other. First side wall section 163 extends from a later-described wall section 165 toward the opening rim of downstream-side opening section 85. Second side wall section 164 extends from outer circumferential side wall section 162 toward the opening rim of downstream-side opening section 85. Extension section 90B is formed between first side wall section 163 and second side wall section 164. The distance between first side wall section 163 and second side wall section 164 increases from the upstream side of the airflow in extension section 90B toward the downstream side of the airflow in extension section Air guide member 81 (first planar section 86) further includes wall section 165. Wall section 165 extends between inner circumferential side wall section 161 and first side wall section 163. Wall section 165 extends from the radial-directional inside about center axis 130 toward the radial-directional outside about center axis 130, while deviating in the circumferential direction about center axis 130. The axial width of wall section 165 in the circumferential direction about center axis 130 is smaller than the width of rib section 68j in the circumferential direction about center axis 130.

As shown in FIG. 5, wall section 165 is disposed at a position that overlaps with rib section 68j as viewed in the axial direction about center axis 130. It is allowable to adopt a configuration in which wall section 165 and rib section 68j partially overlap with each other as viewed in the axial direction about center axis 130.

As shown in FIG. 8, air flow passage 90 extends around center axis section 63 from a starting point that is one space 210 separated by wall section 165, and further extends in a direction of getting away from center axis section 63 through the other space 220 separated by wall section 165, as viewed in the axial direction about center axis 130. Space 210 and space 220 are provided on both sides of wall section 165 as viewed in the axial direction about center axis 130.

A direction in which round section 90A extends around center axis 130 from space 210 as the starting point toward space 220 is the same as the rotation direction of the plurality of blade sections 66 in blower device 61. Air flow passage 90 may be configured such that the flow passage area increases from the upstream side of the airflow toward the downstream side of the airflow.

Figure 9:
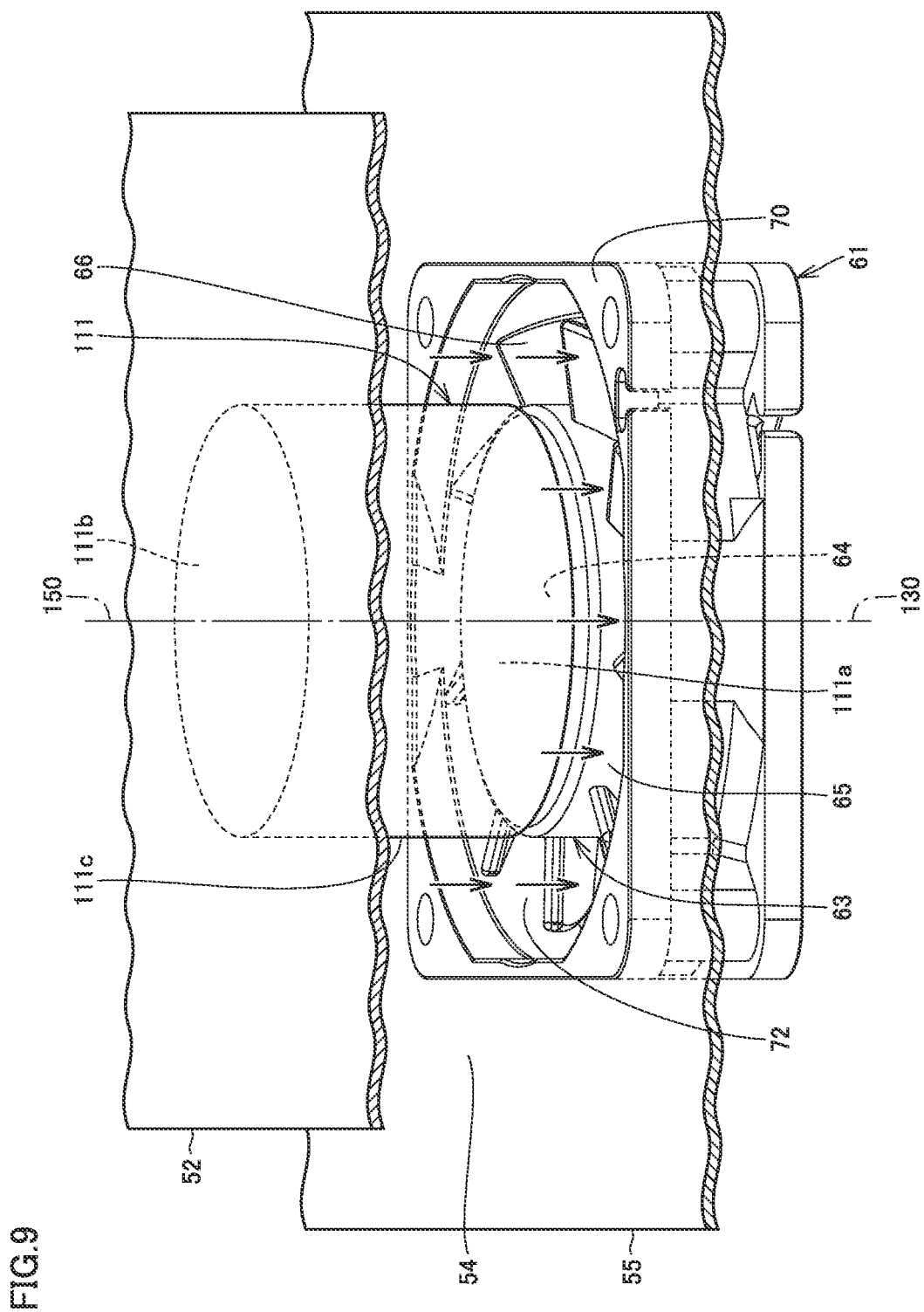
FIG. 9 is a perspective view showing a range surrounded by two-dot chain line IX in FIG. 3.
Figure 10:
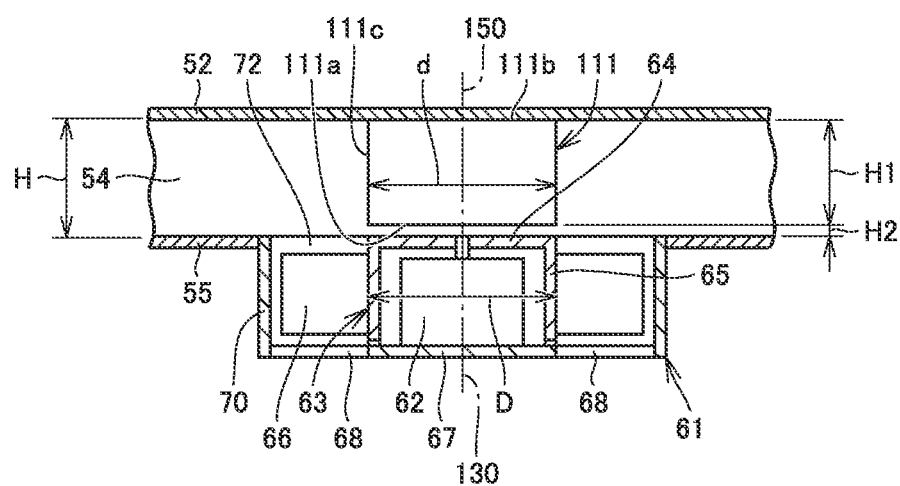
FIG. 10 is a sectional view showing the range surrounded by two-dot chain line IX in FIG. 3.

Next, a structure for reducing the noise that is generated due to the blowing by blower device 61 will be described. FIG. 9 is a perspective view showing a range surrounded by two-dot chain line IX in FIG. 3. FIG. 10 is a sectional view showing the range surrounded by two-dot chain line IX in FIG. 3.

With reference to FIG. 9 and FIG. 10, opposed wall 52 is disposed on the air suction side of blower device 61. Opposed wall 52 is disposed so as to face blower device 61 in the axial direction about center axis 130. Opposed wall 52 is disposed so as to face center axis section 63 (first disk section 64) in the axial direction about center axis 130. Opposed wall 52 is disposed parallel to first disk section 64.

Operation panel 10 further includes an intermediate member 111. Intermediate member 111 may be made of resin, or may be made of metal.

Intermediate member 111 is provided between opposed wall 52 and center axis section 63 in the axial direction about center axis 130. Intermediate member 111 is provided in air passage 54. Intermediate member 11l is provided at a position where center axis section 63 (first disk section 64) is projected in the axial direction about center axis 130.

Intermediate member 111 has a circular columnar shape around a center axis 150. Center axis 150 extends in the axial direction about center axis 130. Center axis 150 extends on a straight line resulting from elongating center axis 130. The diameter d of intermediate member 111 around center axis 150 is equal to the diameter D of center axis section 63 around center axis 130 (d=D).

Intermediate member 111 includes a first end surface 111a, a second end surface 111b and an outer circumferential surface 111c. First end surface 111a and second end surface 111b are constituted by circular planes orthogonal to center axis 150. Outer circumferential surface 111c is constituted by a cylindrical surface around center axis 150. Outer circumferential surface 111c is continuous with a peripheral section of first end surface 111a, at one end in the axial direction about center axis 150, and is continuous with a peripheral section of second end surface 111b, at the other end in the axial direction about center axis 150.

Intermediate member 111 (first end surface 111a) faces center axis section 63 (first disk section 64) in the axial direction about center axis 150, while a gap is provided. Intermediate member 111 (second end surface 111b) is connected to opposed wall 52.

The distance H between opposed wall 52 and partition wall section 55 in the axial direction about center axis 130, for example, may be in a range of 5 mm or more and 25 mm or less, or may be in a range of 10 mm or more and 20 mm or less. The ratio of length H1 of intermediate member 111 in the axial direction about center axis 130 and size H2 of the gap between intermediate member 111 and center axis section 63 in the axial direction about center axis 130, for example, may be in a range of $0<H2/H1\leq 1/5$, or may be in a range of $0<H2/H1\leq 1/10$.

Figure 11:
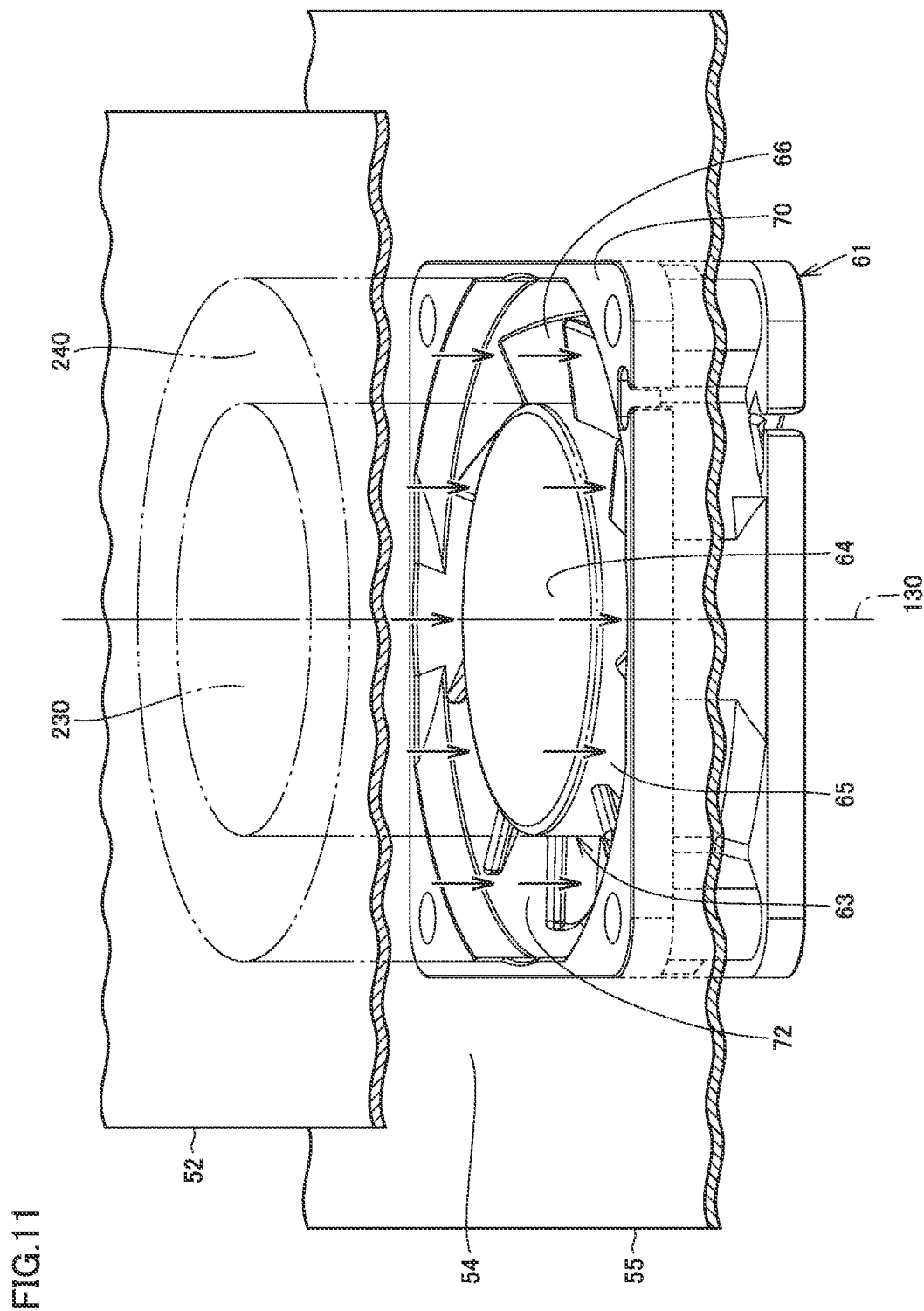
FIG. 11 is a perspective view showing an operation panel in a comparative example.

FIG. 11 is a perspective view showing an operation panel in a comparative example. FIG. 11 corresponds to FIG. 9. With reference to FIG. 11, in the comparative example, intermediate member 111 in FIG. 9 is not provided in air passage 54. In air passage 54, a first region 230 and a second region 240 are shown. First region 230 faces center axis section 63 in the axial direction about center axis 130. First region 230 has a circular columnar shape around center axis 130. Second region 240 faces space 72 in the axial direction about center axis 130. Second region 240 has a ring shape around center axis 130, and is disposed on an outer circumference of first region 230.

In this configuration, due to the rotation of the plurality of blade sections 66, in second region 240, the airflow from air passage 54 on the outer circumferential side of second region 240 toward space 72 is produced as laminar flow. On the other hand, first region 230 is positioned on the inside of second region 240 in which the active airflow is produced, and therefore the pressure in first region 230 becomes lower than the pressure in second region 240. On this occasion, the airflow from first region 230 toward space 72 through second region 240 is randomly produced, and thereby turbulent flow is produced in first region 230. The turbulent flow produced in first region 230 causes the generation of high-frequency noise. Particularly, in a configuration in which opposed wall 52 and center axis section 63 are disposed so as to be close to each other, the generation of the noise becomes prominent.

With reference to FIG. 9 and FIG. 10, in the embodiment, intermediate member 111 occupies the space (first region 230) between opposed wall 52 and center axis section 63 in the axial direction about center axis 130, and thereby the turbulent flow is prevented from being generated at the position that faces center axis section 63. Thereby, it is possible to restrain the high-frequency noise from being generated due to the blowing by blower device 61.

Moreover, in the embodiment, center axis 150 of intermediate member 111 having a circular columnar shape extends in the axial direction about center axis 130 of center axis section 63, and furthermore, center axis 150 of intermediate member 111 extends on the straight line resulting from elongating center axis 130 of center axis section 63. Because of this configuration, intermediate member 111 can more efficiently occupy the space (first region 230) between opposed wall 52 and center axis section 63 in the axial direction about center axis 130, and therefore it is possible to further restrain the generation of the noise.

Moreover, in the embodiment, intermediate member 111 is connected to opposed wall 52. Because of this configuration, it is not necessary to separately provide a support structure for supporting intermediate member 111, and therefore it is possible to simplify the configuration of the interior of first case 31U.

The above-described structure of operation panel 10 for the machine tool in Embodiment 1 of the invention is summarized as follows. Operation panel 10 for the machine tool in the embodiment includes: blower device 61 that includes the plurality of blade sections 66 and center axis section 63, the plurality of blade sections 66 being disposed so as to be spaced from each other in the circumferential direction about center axis 130 as a predetermined axis and rotating around center axis 130, center axis section 63 having a circular columnar shape around center axis 130 and being disposed on the radial-directional inside about center axis 130 relative to the plurality of blade sections 66, blower device 61 sucking air in the axial direction about center axis 130 and blowing out the air in the axial direction about center axis 130; opposed wall 52 that is disposed on the air suction side of blower device 61 and that is disposed so as to face blower device 61 in the axial direction about center axis 130; and intermediate member 111 that is provided between opposed wall 52 and center axis section 63 in the axial direction about center axis 130.

According to operation panel 10 for the machine tool in Embodiment 1 of the invention configured in this way, intermediate member 111 occupies the space between opposed wall 52 and center axis section 63, in which the turbulent flow in the airflow is expected to be produced, and thereby it is possible to restrain the noise from being generated due to the blowing by blower device 61.

Embodiment 2

In the embodiment, various modifications of intermediate member 111 described in Embodiment 1 will be described. FIG. 12 to FIG. 16 are sectional views showing various modifications of the intermediate member. FIG. 12 to FIG. 16 correspond to FIG. 10 in Embodiment 1.

Figure 12:
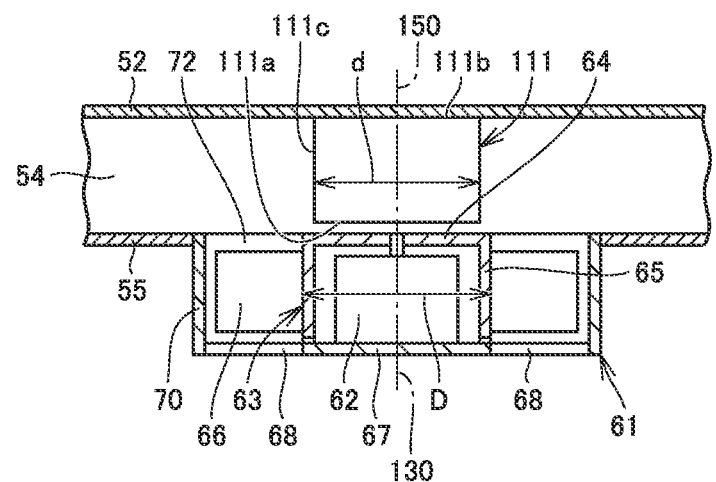
FIG. 12 is a sectional view showing a first modification of an intermediate member.

With reference to FIG. 12, in the modification, the diameter d of intermediate member 111 around center axis 150 is smaller than the diameter D of center axis section 63 around center axis 130 (d<D).

Figure 13:
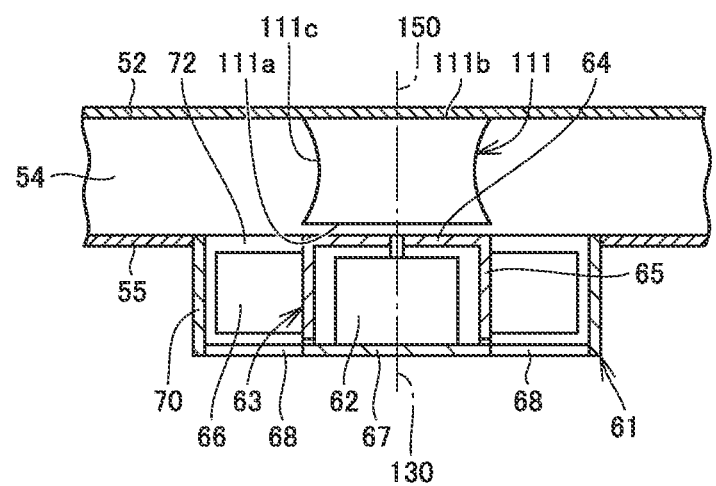
FIG. 13 is a sectional view showing a second modification of the intermediate member.

With reference to FIG. 13, in the modification, outer circumferential surface 111c of intermediate member 111 has a constricted shape. In the axial direction about center axis 150, the diameter of outer circumferential surface 111c around center axis 150 is smallest at an intermediate position of intermediate member 111 in the axial direction about center axis 150, and increases from the intermediate position at a position closer to opposed wall 52 and center axis section 63 in the axial direction about center axis 150.

Figure 14:
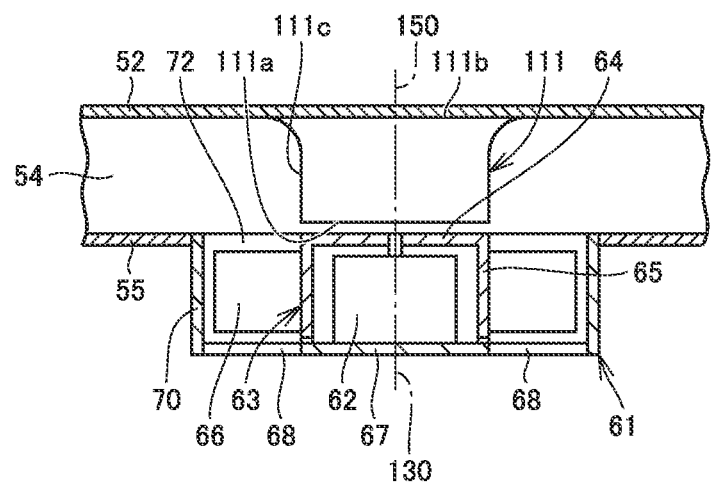
FIG. 14 is a sectional view showing a third modification of the intermediate member.

With reference to FIG. 14, in the modification, a corner section between outer circumferential surface 111c of intermediate member 111 and opposed wall 52 is constituted by a curved surface.

Figure 15:
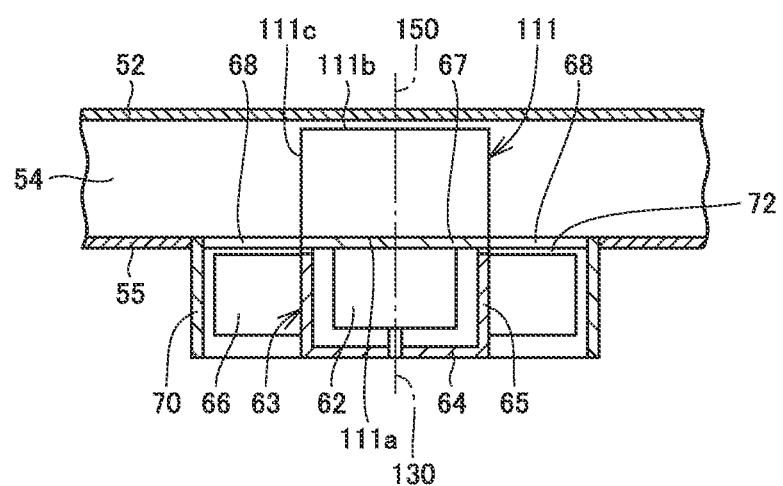
FIG. 15 is a sectional view showing a fourth modification of the intermediate member.
Figure 16:
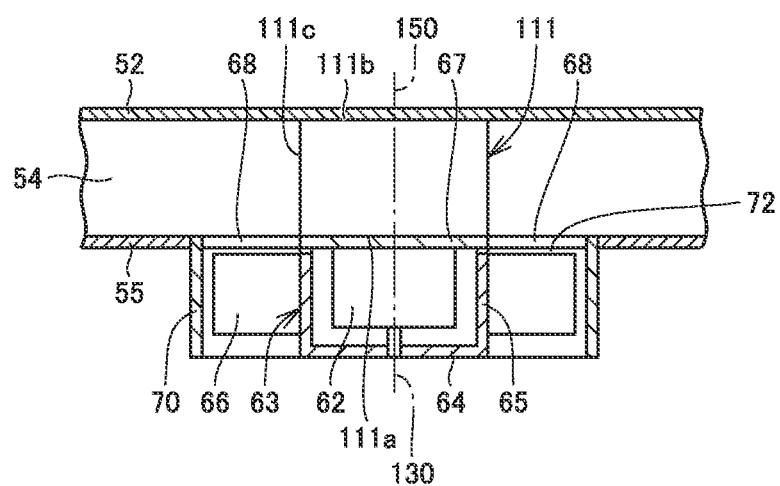
FIG. 16 is a sectional view showing a fifth modification of the intermediate member.

With reference to FIG. 15 and FIG. 16, in the modifications, first disk section 64 is disposed on the ejection side, and second disk section 67 is disposed on the suction side. Second disk section 67 and fan guard 70 are connected to each other by the plurality of rib sections 68 disposed on the suction side.

In the modification shown in FIG. 15, intermediate member 111 (first end surface 111a) is connected to center axis section 63 (second disk section 67). Intermediate member 111. (second end surface 111b) faces opposed wall 52 in the axial direction about center axis 150, while a gap is provided. In the modification shown in FIG. 16, intermediate member 111 (first end surface 111a) is connected to center axis section 63 (second disk section 67). Intermediate member 111 (second end surface 111b) is connected to opposed wall 52.

According to the operation panel for the machine tool in Embodiment 2 of the invention configured in these ways, it is possible to exert the effect described in Embodiment 1 similarly.

It should be understood that the embodiments disclosed herein are examples and are not limitative in all respects. It is intended that the scope of the present invention is shown not by the above description but by the claims and includes all alterations within a meaning and range equivalent to the claims.

INDUSTRIAL APPLICABILITY

The invention is applied to an operation panel that is used for a machine tool.

REFERENCE SIGNS LIST

10 operation panel, 21 cover body, 23 front cover, 25 door section, 26 opening section, 31 case, 31L second case, 31U first case, 32 operation section, 36 display section, 41 display device, 42 substrate, 43 electronic component, 44 radiator plate, 45 fin, 47 heatsink, 52 opposed wall, 53 intake port, 54 air passage, 55 partition wall section, 57 end section, 61 blower device, 62 motor, 63 center axis section, 64 first disk section, 65 cylinder section, 66 blade section, 67 second disk section, 68, 68*j* rib section, fan guard, 71 wire, 72, 210, 220 space, 81 air guide member, 84 upstream-side opening section, 85 downstream-side opening section, 86 first planar section, 87 inclined section, 88 second planar section, 90 air flow passage, 90A round section, 90B extension section, 100 machine tool, 111 intermediate member, 111*a* first end surface, 111*b* second end surface, 111*c* outer circumferential surface, 120 pivoting center axis, 130, 150 center axis, 160 peak section, 161 inner circumferential side wall section, 162 outer circumferential side wall section, 163 first side wall section, 164 second side wall section, 165 wall section, 230 first region, 240 second region

The invention claimed is:

1. An intermediate member that is provided between the opposed wall and the center axis section in the 3 axial direction about the predetermined axis, wherein the intermediate member is connected to the opposed wall.

2. The operation panel for the machine tool according to claim 1, wherein:

the intermediate member has a circular columnar shape; and a center axis of the intermediate member extends in the axial direction about the predetermined axis.

3. The operation panel for the machine tool according to claim 2, wherein the center axis of the intermediate member extends on a straight line resulting from elongating the predetermined axis.

4. The operation panel for the machine tool according to claim 1, comprising a case that includes the opposed wall and that accommodates the blower device, the opposed wall performing compartment formation of an internal space that accommodates the blower device, the operation panel further comprising a partition wall section that is disposed in the case so as to face the opposed wall and to which the blower device is attached, wherein an air passage through which air flows toward the blower device is provided between the opposed wall and the partition wall section.

* * * * *